US010889102B2

(12) United States Patent
Harris et al.

(10) Patent No.: US 10,889,102 B2
(45) Date of Patent: Jan. 12, 2021

(54) WORKPIECE REFERENCING SYSTEM FOR AND METHOD OF REFERENCING WORKPIECES SUPPORTED BY A WORKPIECE CARRIER

(71) Applicant: ASM Assembly Systems Singapore Pte. Ltd., Singapore (SG)

(72) Inventors: Tom Harris, Dorset (GB); Ricky Bennett, Flemington, NJ (US)

(73) Assignee: ASM ASSEMBLY SYSTEMS SINGAPORE PTE. LTD, Singapore (SG)

( * ) Notice: Subject to any disclaimer, the term of this patent is extended or adjusted under 35 U.S.C. 154(b) by 440 days.

(21) Appl. No.: 14/782,847

(22) PCT Filed: Apr. 8, 2014

(86) PCT No.: PCT/EP2014/057076
§ 371 (c)(1),
(2) Date: Oct. 7, 2015

(87) PCT Pub. No.: WO2014/166956
PCT Pub. Date: Oct. 16, 2014

(65) Prior Publication Data
US 2016/0039196 A1 Feb. 11, 2016

Related U.S. Application Data

(60) Provisional application No. 61/809,558, filed on Apr. 8, 2013.

(51) Int. Cl.
*B41F 15/18* (2006.01)
*H01L 21/68* (2006.01)

(52) U.S. Cl.
CPC ............ *B41F 15/18* (2013.01); *H01L 21/682* (2013.01)

(58) Field of Classification Search
CPC ............................... B41F 15/18; H01L 21/682
See application file for complete search history.

(56) References Cited

U.S. PATENT DOCUMENTS 5,882,055 A * 3/1999 Smith .................. B25J 15/0616
414/752.1
6,370,766 B1 * 4/2002 Degani .............. G01R 31/2818
29/832

(Continued)

FOREIGN PATENT DOCUMENTS

WO    WO 97/30819 A1    8/1997

OTHER PUBLICATIONS

International Search Report dated Sep. 15, 2014 issued in corresponding International patent application No. PCT/EP2014/057076.

*Primary Examiner* — Rick K Chang
(74) *Attorney, Agent, or Firm* — Ostrolenk Faber LLP

(57) ABSTRACT

A workpiece referencing system and method, the system having a workpiece support assembly for supporting a plurality of workpieces, wherein the support assembly includes a support platform and a plurality of support members which are disposed to the support platform, each support member being configured to support an individual workpiece; and a workpiece referencing assembly for referencing the workpieces, as supported by the support assembly, to predetermined positions; wherein the support members each includes a body which includes a support surface which supports a workpiece and a resilient coupling which resiliently couples at least an upper part of the body relative to the support platform, such that the at least part of the body is displaceable relative to the support platform from a first, unbiased position to a second, biased reference position by operation of the referencing assembly, and, when released, the at least part of the body returns to the first, unbiased position.

17 Claims, 15 Drawing Sheets

(56) References Cited

U.S. PATENT DOCUMENTS

| | | | |
|---|---|---|---|
| 6,425,178 B1 * | 7/2002 | Lee | G01R 31/2867 |
| | | | 206/561 |
| 6,609,304 B1 | 8/2003 | Mishler | |
| 7,540,503 B2 * | 6/2009 | Yang | B25B 11/005 |
| | | | 279/3 |
| 2004/0177520 A1 | 9/2004 | Nakamura et al. | |

* cited by examiner

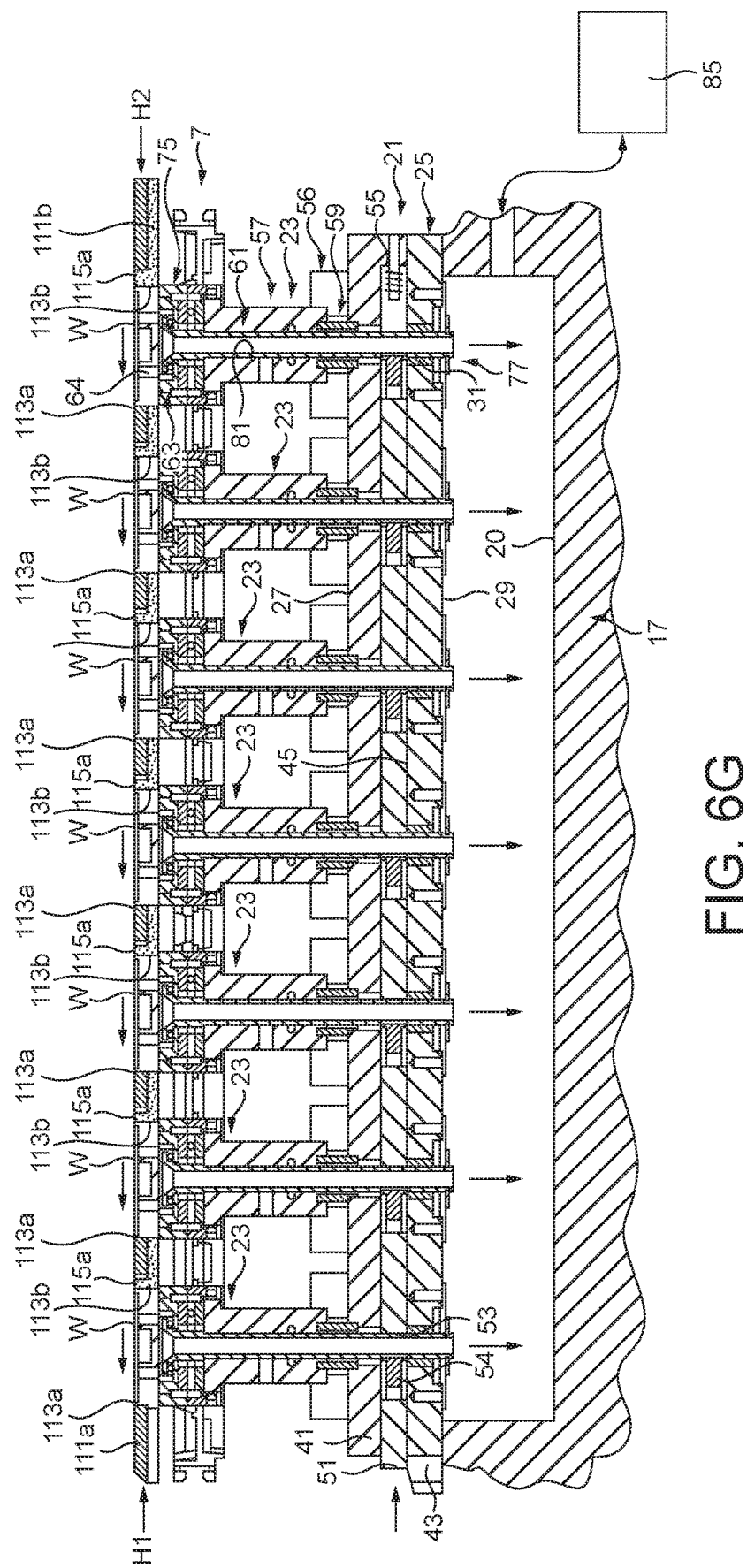

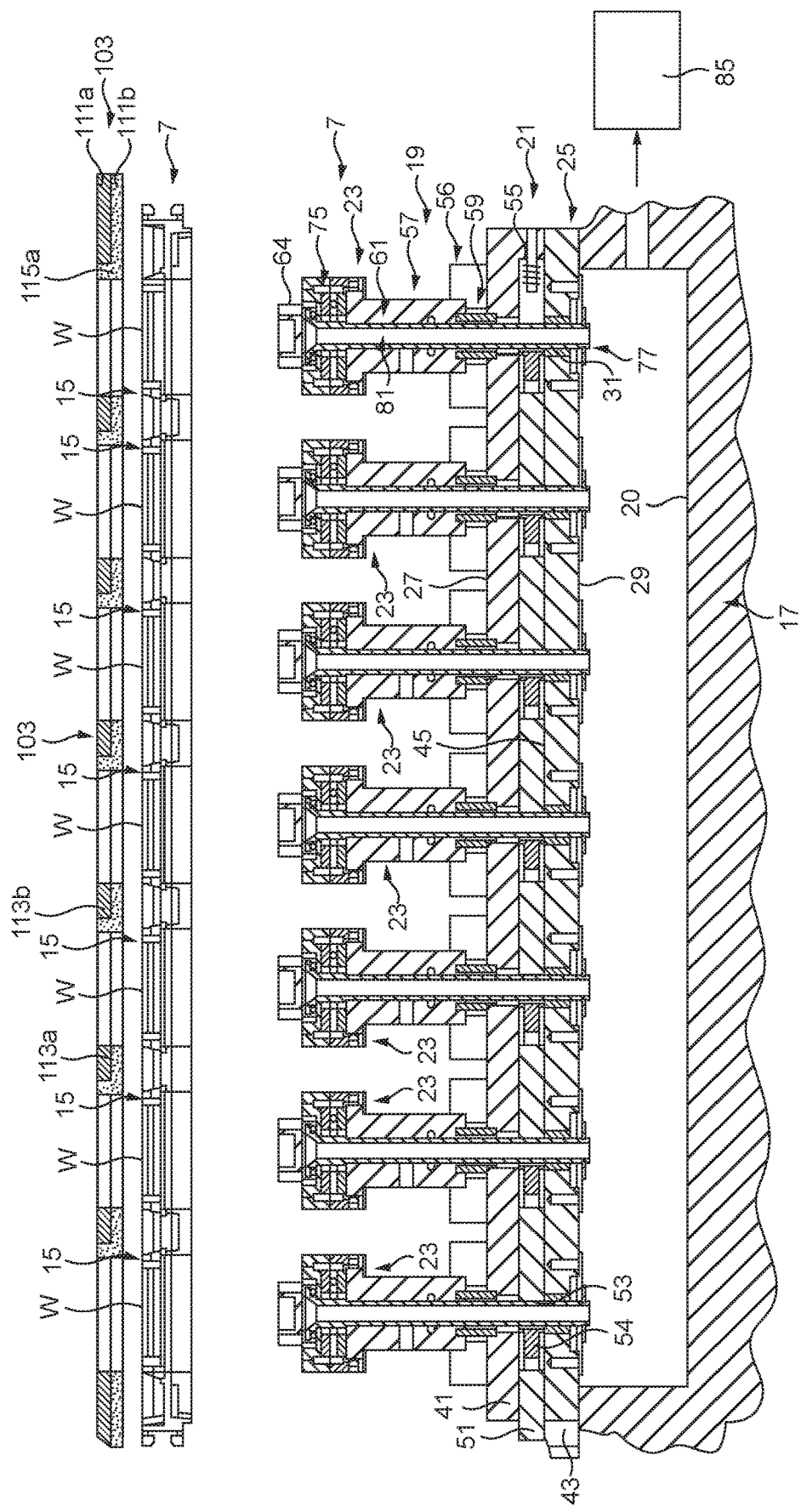

WORKPIECE REFERENCING SYSTEM FOR AND METHOD OF REFERENCING WORKPIECES SUPPORTED BY A WORKPIECE CARRIER

CROSS REFERENCE TO RELATED APPLICATIONS

The present application is a 35 U.S.C. § 371 National Phase conversion of PCT/EP2014/057076, filed Apr. 8, 2014, which claims benefit of U.S. Provisional Application No. 61/809,558, filed Apr. 8, 2013, the disclosure of which is incorporated herein by reference. The PCT International Application was published in the English language.

TECHNICAL FIELD OF THE INVENTION

The present invention relates to a workpiece referencing system for and a method of referencing a plurality of singulated workpieces, such as electronic substrates, supported in a workpiece carrier, typically for use in a screen printing machine.

SUMMARY OF THE INVENTION

In one aspect the present invention provides a workpiece support assembly for supporting a plurality of singulated workpieces, wherein the support assembly comprises a plurality of support members which each support a workpiece, wherein the support members each comprise a body which includes a support surface which supports a workpiece and a resilient coupling which resiliently couples at least a part of the body which includes the support surface, such that the at least part of the body is displaceable at least in a horizontal orient from a first, unbiased position to a second, biased reference position, and, when released, the at least part of the body returns to the first, unbiased position, thereby in effect being self-centering.

In one embodiment the workpieces are transported in singulated fashion in individual carrier units of a workpiece carrier, and the support members are configured to receive the workpieces from and return the workpieces to the carrier units of the workpiece carrier.

In one embodiment the support members are supported by a support platform which comprises a body which has upper and lower surfaces and includes a plurality of bores which each receive a respective support member.

In one embodiment the body of each support member includes a stem which extends into the respective bore in the support platform.

In one embodiment the stem is slideable within the bore to allow for displacement of the at least part of the body of the support member in a vertical orient.

In one embodiment the stem extends from the at least part of the body through the respective bore in the support platform, whereby a vacuum or reduced pressure source is applied to the support surface, such as to fix a supported workpiece at a defined position thereon.

In one embodiment the vacuum or reduced pressure maintains the workpiece flat, where the workpiece is warped or flexible.

In one embodiment the stems each define a fluid channel which extends between the respective at least part of the body and a lower surface of the support platform which is commonly fluidly connected by a manifold.

In one embodiment the support platform further comprises a locking member which is actuatable to lock the bodies of the support members at a referenced vertical or Z-axis position.

In one embodiment the locking member includes a plurality of apertures which are arranged in correspondence with the plurality of bores in the support platform, and is displaceable between a first, unlocked position, in which the at least parts of the bodies of the support members are movable vertically relative to the body of the support platform, such as to allow for adjustment of the vertical or Z-axis positions of the support members, and a second, locked position in which the locking member engages the support members and locks the vertical or Z-axis positions of the support members.

In one embodiment the locking member is biased to the first, unlocked position, such that, when the locking member is released, the locking member adopts the first, unlocked position.

In one embodiment the support members each further comprise a base to which the at least part of the body of the support member is movably coupled in a vertical orient, and a biasing element which acts to bias the at least part of the body of the support member from the base of the support member, such as to allow for movement of the at least part of the body of the support member relative to the base of the support member from a first, rest position on application of a bias to the body of the support member and provide for the body of the support member to be returned to the first, rest position on release of the bias as applied against the biasing element.

In one embodiment the base of the support member is attached to the support platform.

In one embodiment the body of the support member comprises a lower body part and an upper body part which includes the support surface and is movably coupled to the lower body part, such that the upper body part is displaceable relative to the lower body part.

In one embodiment the upper body part has a head which includes the support surface for supporting a workpiece.

In one embodiment the head is replaceable.

In one embodiment the upper body part is replaceable.

In one embodiment the resilient coupling couples the upper body part to the lower body part.

In one embodiment the resilient coupling comprises an elastomeric or rubber coupling which is deflectable.

In one embodiment the resilient coupling is formed of a low durometer material or a foam material, optionally in the form of a disk or sleeve.

In one embodiment the resilient coupling comprises one or more spring elements.

In one embodiment the resilient coupling comprises one or more helicoidal or leaf springs.

In one embodiment the resilient coupling comprises one or more resilient elements.

In one embodiment the resilient coupling comprises a single resilient element.

In another embodiment the resilient coupling comprises a plurality of resilient elements.

In one embodiment the resilient elements comprise elastomeric or rubber elements.

In one embodiment the support assembly comprises an integral support module which includes the support members and is removable from a processing machine, such as a screen printing machine, as a single unitary assembly.

In one embodiment the support assembly is re-configurable, such that the support members can be arranged in any desired configuration.

The present invention also extends to a workpiece referencing system incorporating the above-described workpiece support assembly.

In another aspect the present invention provides a workpiece referencing system, comprising: the above-described workpiece support assembly; and a workpiece referencing assembly for referencing workpieces, as supported by the support assembly, to predetermined positions.

In one embodiment the referencing assembly comprises a horizontal referencer for referencing the workpieces to predetermined positions in a horizontal orient.

In one embodiment the horizontal referencer comprises a horizontal referencing unit which comprises at least one horizontal referencing member which includes a plurality of referencing surfaces which are arranged in correspondence to the support members such as to engage the workpieces as supported by the respective support members when the at least one horizontal referencing member is moved in a horizontal orient.

In one embodiment the referencing surfaces each comprise at least one elongate edge or discrete contact point.

In one embodiment the referencing surfaces each comprise a plurality of elongate edges or discrete contact points.

In one embodiment the contact point or points comprise resilient elements.

In one embodiment the contact point or points comprise elastomeric or rubber elements.

In another embodiment the contact point or points comprise spring elements.

In one embodiment the contact point or points comprise helicoidal or leaf springs.

In one embodiment the at least one horizontal referencing member comprises a plate element which includes a plurality of apertures which each define at least one referencing surface.

In one embodiment the at least one horizontal referencing member is moved along an axis which is inclined to at least one edge of the workpieces.

In one embodiment the workpieces have orthogonal edges, and the at least one horizontal referencing member is moved in a direction intermediate the two orthogonal edges, optionally from about 35 degrees to about 55 degrees thereto.

In one embodiment the horizontal referencing unit comprises first and second horizontal referencing members which each include a plurality of referencing surfaces which are arranged in correspondence to the support members, and the horizontal referencing members are movable in different directions, such as each to engage the workpieces as supported by the respective support members when the horizontal referencing members are moved in a horizontal orient.

In one embodiment the horizontal referencing members are moved in substantially opposite directions.

In one embodiment the horizontal referencing members each comprise a plate element which includes a plurality of apertures which each define at least one referencing surface.

In one embodiment one of the horizontal referencing members includes apertures of fixed shape which are oversized relative to the size of the workpieces, at least one edge of which includes a first referencing surface, and the other of the horizontal referencing members includes counterpart apertures, at least one edge of which includes a projection which extends into the respective apertures in the one horizontal referencing member and provides a second referencing surface, whereby movement of the first and second horizontal referencing members acts to engage the workpieces by the first and second referencing surfaces and position the workpieces in predetermined referencing positions.

In one embodiment the referencing assembly comprises a vertical referencer which is operative to reference the workpieces as supported by the support members to a common height or vertical or Z-axis position.

In one embodiment the vertical referencer comprises a vertical referencing member which is in use disposed at a predetermined height or vertical or Z-axis position above the support assembly and acts to reference the workpieces as supported by the support members to a common height or vertical or Z-axis position.

In one embodiment the vertical referencing member comprises a plate element.

In one embodiment the vertical referencing member has a planar lower surface.

In one embodiment the system further comprises: a transport mechanism for moving the vertical referencing member from a first, storage position to a second position above the support assembly.

In one embodiment the transport mechanism comprises a support cradle which supports the vertical referencing member, a pivotable linkage which is coupled to the support cradle and acts to translate the support cradle between the first and second positions, and an actuator which is operable to move the support cradle between the first and second positions.

In one embodiment the support cradle comprises first and second arms which engage lateral edges of the vertical referencing member and a body which supports the arms in fixed relation, optionally the arms are cantilevered from the body.

In one embodiment the pivotable linkage comprises a plurality of links.

In a further aspect the present invention provides a workpiece referencing assembly for referencing workpieces, as supported by support members of a support assembly, to predetermined positions, wherein the referencing assembly comprises a horizontal referencer for referencing the workpieces to predetermined positions in a horizontal orient.

In one embodiment the horizontal referencer comprises a horizontal referencing unit which comprises at least one horizontal referencing member which includes a plurality of referencing surfaces which are arranged in correspondence to the support members such as to engage the workpieces as supported by the respective support members when the at least one horizontal referencing member is moved in a horizontal orient.

In one embodiment the referencing surfaces each comprise at least one elongate edge or discrete contact point.

In another embodiment the referencing surfaces each comprise a plurality of elongate edges or discrete contact points.

In one embodiment the contact point or points comprise resilient elements.

In one embodiment the contact point or points comprise elastomeric or rubber elements.

In another embodiment the contact point or points comprise spring elements.

In one embodiment the contact point or points comprise helicoidal or leaf springs.

In one embodiment the at least one horizontal referencing member comprises a plate element which includes a plurality of apertures which each define at least one referencing surface.

In one embodiment the at least one horizontal referencing member is moved along an axis which is inclined to at least one edge of the workpieces.

In one embodiment the workpieces have orthogonal edges, and the at least one horizontal referencing member is moved in a direction intermediate the two orthogonal edges, optionally from about 35 degrees to about 55 degrees thereto.

In one embodiment the horizontal referencing unit comprises first and second horizontal referencing members which each include a plurality of referencing surfaces which are arranged in correspondence to the support members, and the horizontal referencing members are movable in different directions, such as to engage the workpieces as supported by the respective support members when the horizontal referencing members are moved in a horizontal orient.

In one embodiment the horizontal referencing members are moved in substantially opposite directions.

In one embodiment the horizontal referencing members each comprise a plate element which includes a plurality of apertures which each define at least one referencing surface.

In one embodiment one of the horizontal referencing members includes apertures of fixed shape which are oversized relative to the size of the workpieces, at least one edge of which includes a first referencing surface, and the other of the horizontal referencing members includes counterpart apertures, at least one edge of which includes a projection which extends into the respective apertures in the one horizontal referencing member and provides a second referencing surface, whereby movement of the first and second horizontal referencing members acts to engage the workpieces by the first and second referencing surfaces and position the workpieces in predetermined referencing positions.

In one embodiment the referencing assembly comprises a vertical referencer which is operative to reference the workpieces as supported by the support members to a common height or vertical or Z-axis position.

In one embodiment the vertical referencer comprises a vertical referencing member which is in use disposed at a predetermined height or vertical or Z-axis position above the support assembly and acts to reference the workpieces as supported by the support members to a common height or vertical or Z-axis position.

In one embodiment the vertical referencing member comprises a plate element.

In one embodiment the vertical referencing member has a planar lower surface.

In one embodiment the assembly further comprises: a transport mechanism for moving the vertical referencing member from a first, storage position to a second position above the support assembly.

In one embodiment the transport mechanism comprises a support cradle which supports the vertical referencing member, a pivotable linkage which is coupled to the support cradle and acts to translate the support cradle between the first and second positions, and an actuator which is operable to move the support cradle between the first and second positions.

In one embodiment the support cradle comprises first and second arms which engage lateral edges of the vertical referencing member and a body which supports the arms in fixed relation, optionally the arms are cantilevered from the body.

In one embodiment the pivotable linkage comprises a plurality of links.

The present invention also extends to a workpiece referencing system incorporating the above-described workpiece support assembly.

In one embodiment the workpieces each comprise a plurality of workpiece elements which are supported by a common carrier element.

In another embodiment the workpieces each comprise a single workpiece element.

In a still further aspect the present invention provides a support member for supporting a workpiece, wherein the support member comprises a support, a body which includes a support surface which supports a workpiece and a resilient coupling which resiliently couples at least a part of the body relative to the support, such that the at least part of the body is displaceable relative to the support in at least a horizontal orient from a first, unbiased position to a second, biased reference position, and, when released, the at least part of the body returns to the first, unbiased position, thereby in effect self-centering.

In one embodiment the body of the support member includes a stem which extends therethrough from the at least part of the body.

In one embodiment the stem is slideable to allow for displacement of the at least part of the body of the support member in a vertical orient.

In one embodiment the stem extends to the support surface, whereby a vacuum or reduced pressure source is applied to the support surface, such as to fix a supported workpiece at a defined position thereon.

In one embodiment the vacuum or reduced pressure maintains the workpiece flat, where the workpiece is warped or flexible.

In one embodiment the at least part of the body is displaceable in a vertical orient, such as to allow for adjustment of the vertical or Z-axis position of the support member, and lockable at a referenced vertical or Z-axis position.

In one embodiment the support member further comprises a base to which the at least part of the body is movably coupled in the vertical orient, and a biasing element which acts to bias the at least part of the body from the base, such as to allow for movement of the at least part of the body relative to the base from a first, rest position on application of a bias to the body and provide for the body to be returned to the first, rest position on release of the bias as applied against the biasing element.

In one embodiment the base of the support member is attached to a support platform.

In one embodiment the body of the support member comprises a lower body part and an upper body part which includes the support surface and is movably coupled to the lower body part, such that the upper body part is displaceable relative to the lower body part.

In one embodiment the upper body part has a head which includes the support surface for supporting a workpiece.

In one embodiment the head is replaceable.

In one embodiment the upper body part is replaceable.

In one embodiment the resilient coupling couples the upper body part to the lower body part.

In one embodiment the resilient coupling comprises an elastomeric or rubber coupling which is deflectable.

In one embodiment the resilient coupling is formed of a low durometer material or a foam material, optionally in the form of a disk or sleeve.

In one embodiment the resilient coupling comprises one or more spring elements.

In one embodiment the resilient coupling comprises one or more helicoidal or leaf springs.

In one embodiment the resilient coupling comprises one or more resilient elements.

In one embodiment the resilient coupling comprises a single resilient element.

In one embodiment the resilient coupling comprises a plurality of resilient elements.

In one embodiment the resilient elements comprise elastomeric or rubber elements.

In a yet further aspect the present invention provides a method of referencing a plurality of singulated workpieces, the method comprising the steps of: providing a workpiece support assembly for supporting a plurality of workpieces, wherein the support assembly comprises a plurality of support members which are each configured to support a workpiece, wherein the support members each comprise a support, a body which includes a support surface which supports a workpiece and a resilient coupling which resiliently couples at least a part of the body relative to the support, such that the at least part of the body is displaceable relative to the support from a first, unbiased position to a second, biased reference position, and, when released, the at least part of the body returns to the first, unbiased position; providing workpieces to the support surfaces of the support members; referencing the workpieces to predetermined positions in a horizontal orient by displacing the workpieces and the at least part of the body of each of the support members supporting the same in at least a horizontal orient from a first, unbiased position to a second, biased reference position, at which a processing operation, optionally a screen printing operation, is performed; releasing the at least part of the body of each of the support members, whereby the resilient couplings of the support members return the at least part of the body of each of the support members to the first, unbiased position; and removing the workpieces from the support surfaces of the support members.

In one embodiment the workpieces are transported in singulated fashion in individual carrier units of a workpiece carrier, and the support members are configured to receive the workpieces from and return the workpieces to the carrier units of the workpiece carrier.

In one embodiment the method further comprises the step of: applying a vacuum or reduced pressure source to the support surface of each of the support members so as to fix a supported workpiece at a defined position thereon.

In one embodiment the vacuum or reduced pressure maintains the workpiece flat, where the workpiece is warped or flexible.

In one embodiment the body of each support member includes a fluid channel which extends from the support surface thereof to a manifold at which a vacuum or reduced pressure is commonly applied.

In one embodiment the support members are each movable in a vertical orient, and the method further comprises the steps of: referencing the support surface of each of the support members to a common height or vertical or Z-axis position; and locking the bodies of the support members at the referenced height or vertical or Z-axis position.

In one embodiment the support members each further comprise a base to which the at least part of the body of the support member is movably coupled in a vertical orient, and a biasing element which acts to bias the at least part of the body of the support member from the base of the support member, such as to allow for movement of the body of the support member relative to the base of the support member from a first, rest position on application of a bias to the body of the support member and provide for the body of the support member to be returned to the first, rest position on release of the bias as applied against the biasing element.

In one embodiment the base of the support member is attached to a support platform.

In one embodiment the body of the support member comprises a lower body part and an upper body part which includes the support surface and is movably coupled to the lower body part, such that the upper body part is displaceable relative to the lower body part.

In one embodiment the upper body part has a head which includes the support surface for supporting a workpiece.

In one embodiment the head is replaceable.

In one embodiment the upper body part is replaceable.

In one embodiment the resilient coupling couples the upper body part to the lower body part.

In one embodiment the support assembly comprises an integral module which includes the support members and is removable from a processing machine, such as a screen printing machine, as a single unitary assembly.

In one embodiment the support assembly is re-configurable, such that the support members can be arranged in any desired configuration.

In one embodiment the workpieces are referenced to predetermined positions in a horizontal orient by operation of a horizontal referencer.

In one embodiment the horizontal referencer comprises a horizontal referencing unit which comprises at least one horizontal referencing member which includes a plurality of referencing surfaces which are arranged in correspondence to the support members, and the referencing step comprises engaging the workpieces as supported by the respective support members by moving the at least one horizontal referencing member in a horizontal orient such that the referencing surfaces engage the respective workpieces and move the same to predetermined positions in a horizontal orient.

In one embodiment the referencing surfaces each comprise at least one elongate edge or discrete contact point.

In one embodiment the referencing surfaces each comprise a plurality of elongate edges or discrete contact points.

In one embodiment the contact point or points comprise resilient elements.

In one embodiment the at least one horizontal referencing member comprises a plate element which includes a plurality of apertures which each define at least one referencing surface.

In one embodiment the at least one horizontal referencing member is moved along an axis which is inclined to at least one edge of the workpieces.

In one embodiment the workpieces have orthogonal edges, and the at least one horizontal referencing member is moved in a direction intermediate the two orthogonal edges, optionally from about 35 degrees to about 55 degrees thereto.

In one embodiment the horizontal referencing unit comprises first and second horizontal referencing members which each include a plurality of referencing surfaces which are arranged in correspondence to the support members, and the horizontal referencing members are movable in different directions, and the referencing step comprises engaging the workpieces as supported by the respective support members by moving the horizontal referencing members in a horizontal orient, such that the referencing surfaces thereof engage the respective workpieces and move the same to predetermined positions in a horizontal orient.

In one embodiment the horizontal referencing members are moved in substantially opposite directions.

In one embodiment the horizontal referencing members each comprise a plate element which includes a plurality of apertures which each define at least one referencing surface.

In one embodiment one of the horizontal referencing members includes apertures of fixed shape which are oversized relative to the size of the workpieces, at least one edge of which includes a first referencing surface, and the other of the horizontal referencing members includes counterpart apertures, at least one edge of which includes a projection which extends into the respective apertures in the one horizontal referencing member and provides a second referencing surface, whereby movement of the first and second horizontal referencing members acts to engage the workpieces by the first and second referencing surfaces and position the workpieces in predetermined referencing positions.

In one embodiment the method further comprises the step of: referencing the workpieces to predetermined positions in a vertical orient by displacing the workpieces and the at least part of the body of each of the support members supporting the same in at least a vertical orient.

In one embodiment the workpieces are referenced to predetermined positions in a vertical orient by operation of a vertical referencer.

In one embodiment the vertical referencer comprises a vertical referencing member which is disposed at a predetermined height or vertical or Z-axis position and acts to reference the workpieces as supported by the support members to a common height or vertical or Z-axis position, by movement of the support assembly in relation to the vertical referencing member, by movement of the vertical referencing member in relation to the support assembly or by movement of both the support assembly and the vertical referencing member in relation to one another.

In one embodiment the vertical referencing member comprises a plate element.

In one embodiment the step of referencing the workpieces to predetermined positions in a vertical orient comprises moving the vertical referencing member from a first, storage position to a second position above the support assembly, and raising the support assembly such that the workpieces engage a lower surface of the vertical referencing member.

In one embodiment the vertical referencing member is supported by a support cradle which is coupled to a pivotable linkage, and the step of moving the vertical referencing member comprises the step of translating the support cradle between the first and second positions.

In one embodiment the support cradle comprises first and second arms which engage lateral edges of the vertical referencing member and a body which supports the arms in fixed relation, optionally the arms are cantilevered from the body.

In one embodiment the pivotable linkage comprises a plurality of links.

BRIEF DESCRIPTION OF THE DRAWINGS

Preferred embodiments of the present invention will now be described hereinbelow by way of example only with reference to the accompanying drawings, in which.

DESCRIPTION OF PREFERRED EMBODIMENTS

Figure 1:
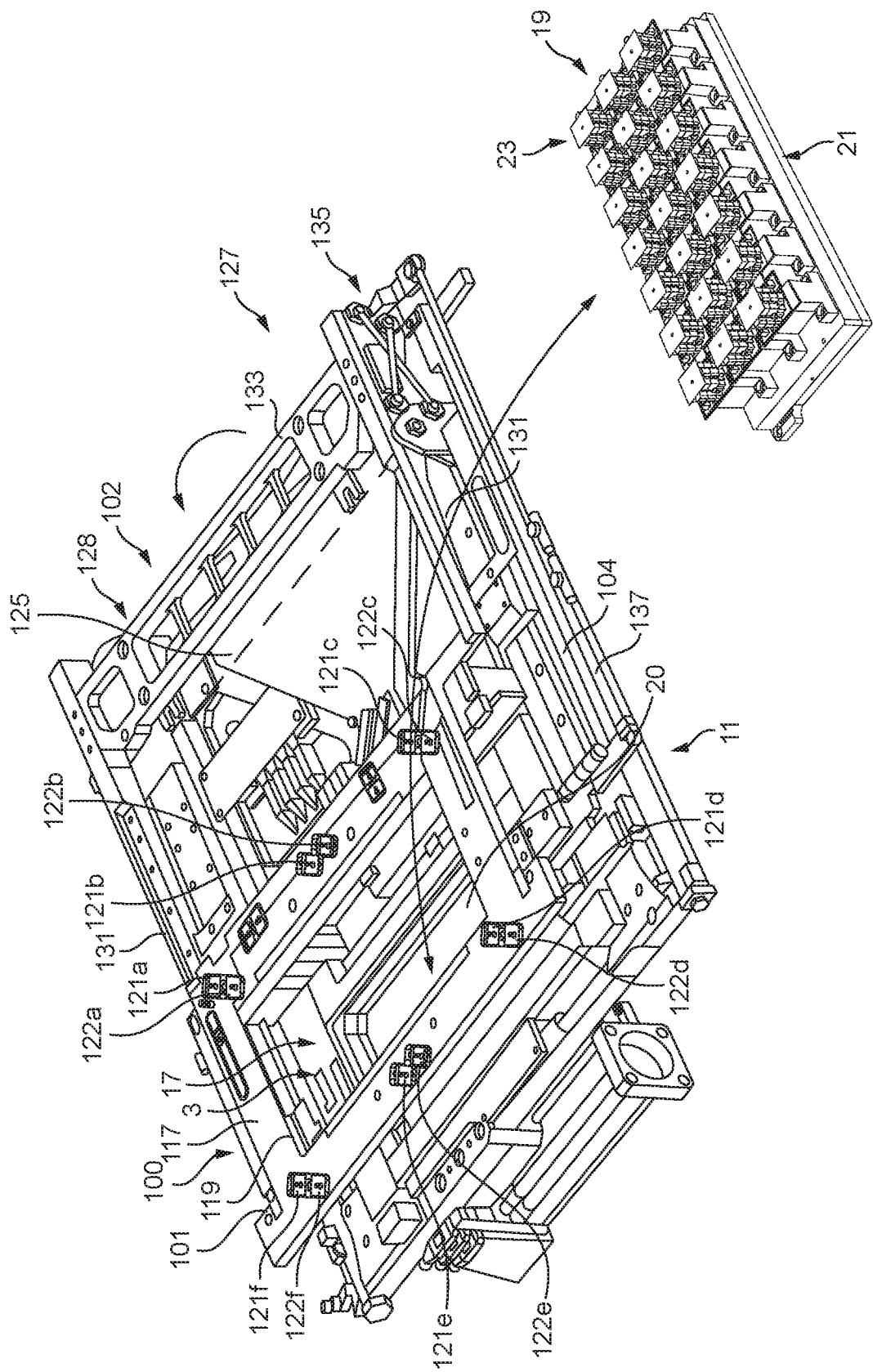
FIG. 1 illustrates a perspective view of a workpiece referencing system in accordance with a preferred embodiment of the present invention, with the workpiece support assembly and the workpiece referencing assembly thereof omitted for ease of illustration.
Figure 2:
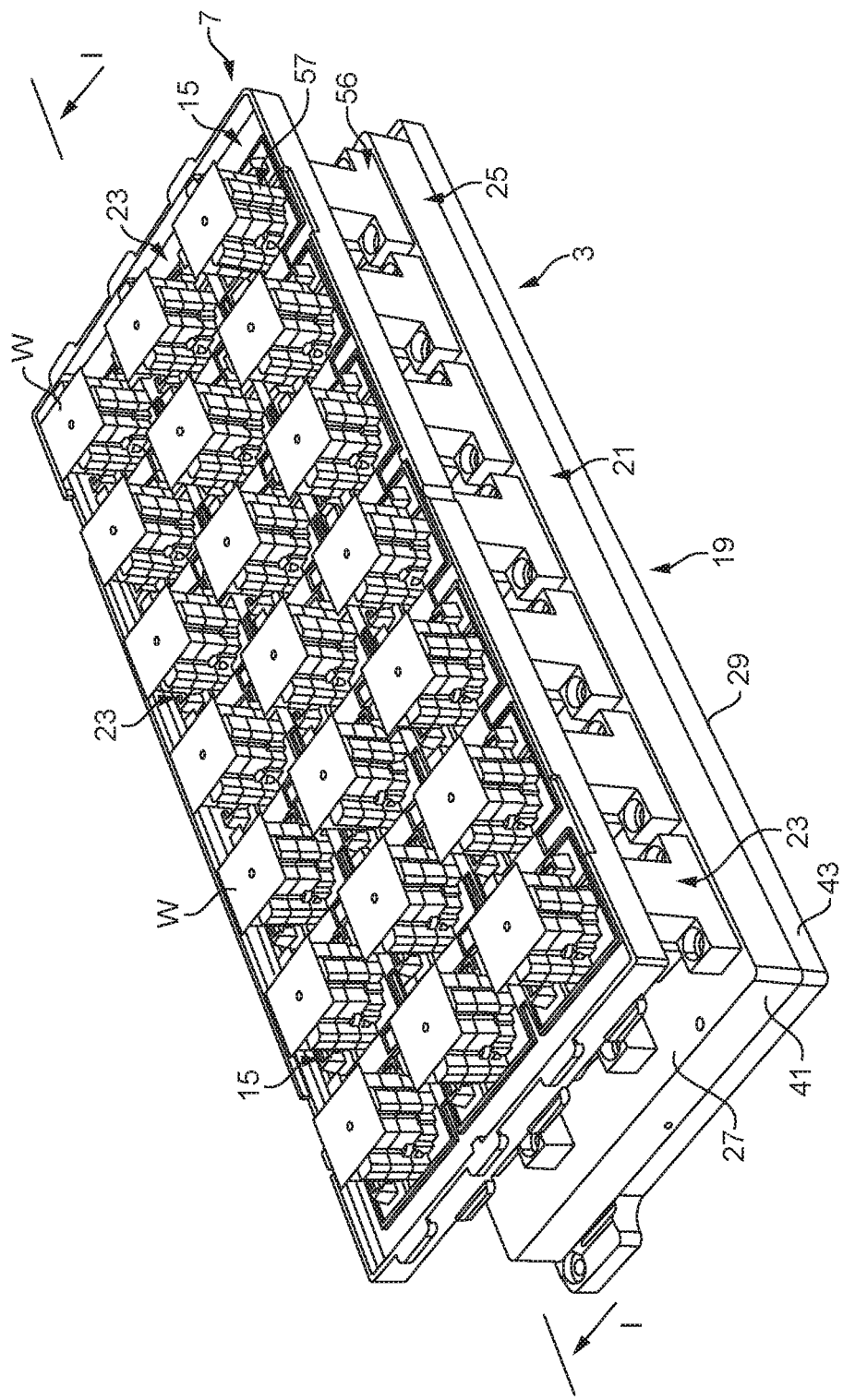
FIG. 2 illustrates a perspective view of the workpiece support assembly of the workpiece referencing system of FIG. 1.
Figure 3:
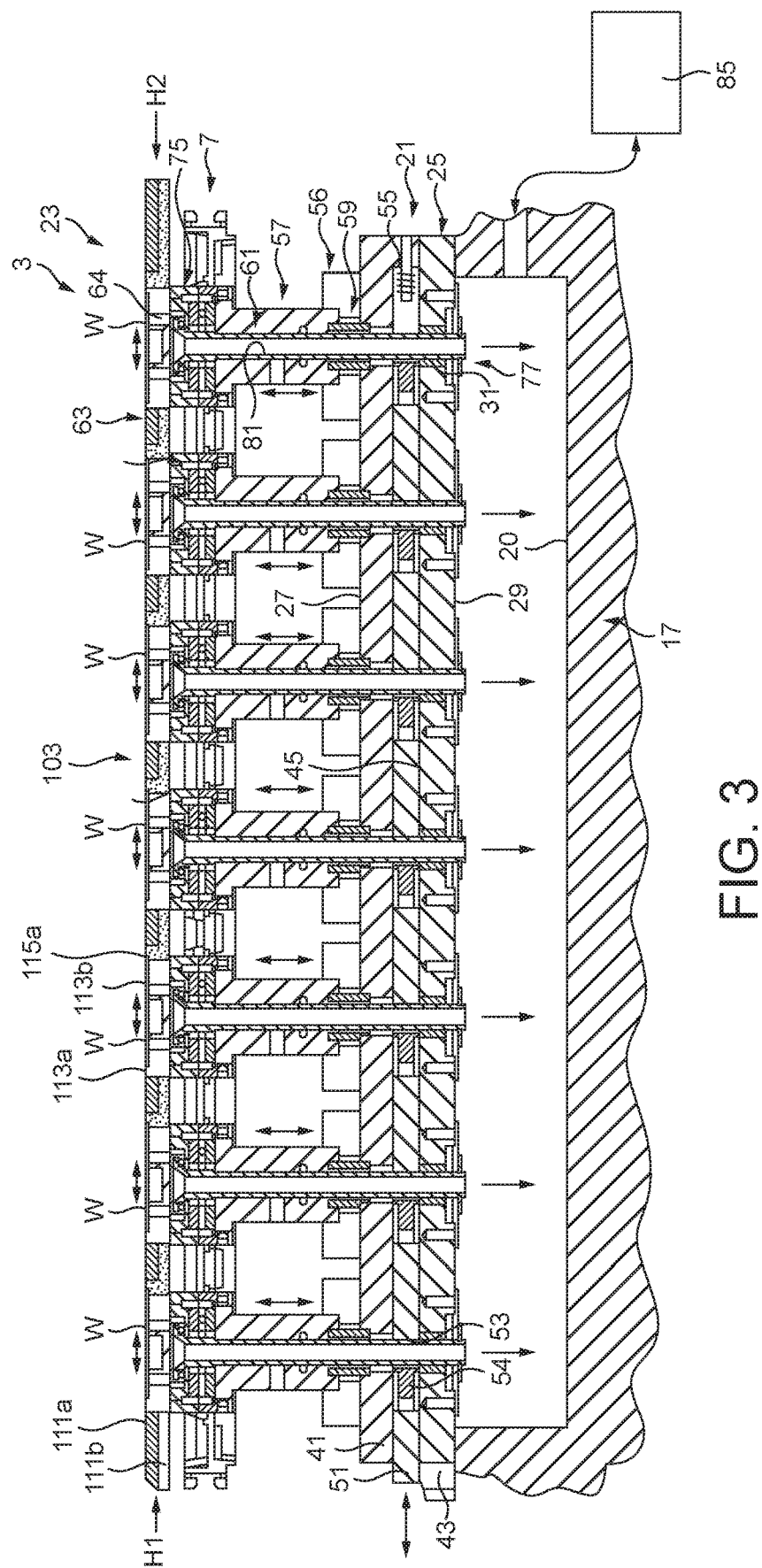
FIG. 3 illustrates a vertical sectional view (along section I-I) of the workpiece support assembly of FIG. 2.
Figure 4:
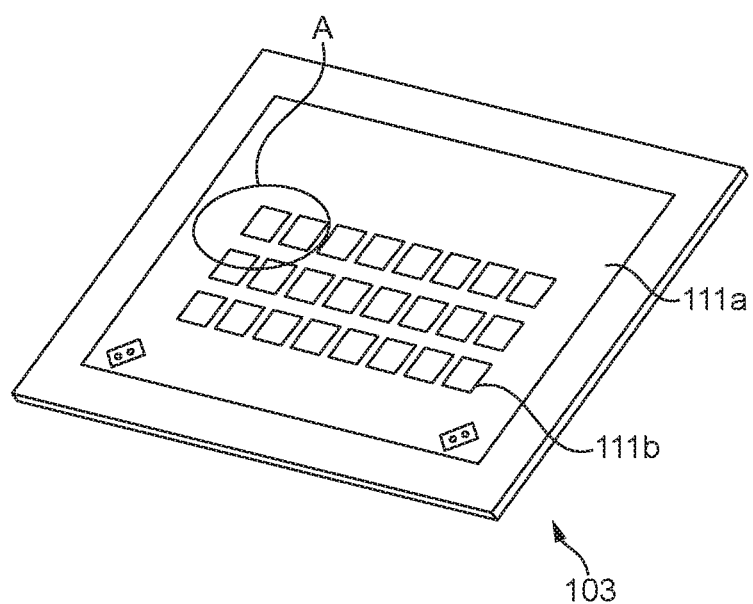
FIG. 4 illustrates a perspective view of the workpiece referencing assembly of the workpiece support system of FIG. 1.
Figure 5:
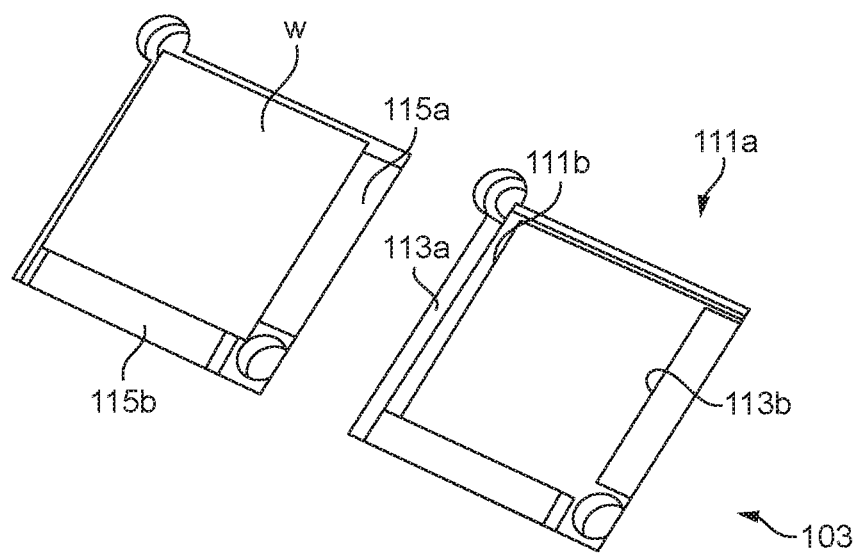
FIG. 5 illustrates an enlarged perspective view (detail A) of the workpiece referencing assembly of FIG. 4.

The workpiece referencing system comprises a workpiece support assembly 3 for individually supporting a plurality of workpieces W which are transported in singulated fashion in a workpiece carrier 7, and a workpiece referencing assembly 11 for referencing the workpieces W, as supported by the support assembly 3, each to predetermined positions.

In this embodiment the workpiece carrier 7 comprises a plurality of carrier units 15, which support individual workpieces W in spaced relation. In this embodiment the carrier units 15 are arranged in a regular array, typically in an m×n array, here in a 3×7 array, but could have any arrangement. In this embodiment the workpiece carrier 7 is JEDEC style carrier or boat, but could have any other style, such as an Auer style.

The support assembly 3 comprises a base unit 17 and a support module 19 which is disposed to the base unit 17. In this embodiment the support module 19 is a removable, replaceable module, which allows for the use of different support modules 19 and thereby accommodates the use of different workpiece carriers 7 and workpieces W without requiring replacement of the entire support assembly 3.

In this embodiment the base unit 17 includes a manifold cavity 20 in an upper surface thereof, to which a platform 21 of the support module 19 is fluidly connected. As will be described in more detail hereinbelow, the manifold cavity 20 is fluidly connected to a vacuum or reduced pressure source 85. With this configuration, individual connections to support members 23 of the support module 19 are not required, and the support module 19 can be removed as an integral assembly.

The support module 19 comprises a support platform 21 and a plurality of support members 23 which are disposed to the support platform 21, each being configured to support an individual workpiece W.

In this embodiment the support members 23 are arranged in a regular array, typically in an m×n array, here in a 3×7 array, which corresponds to the configuration of the carrier units 15 of the workpiece carrier 7, but could have any arrangement.

In this embodiment the support platform 21 comprises a platform body 25, here in the form of a plate, which has upper and lower surfaces 27, 29 and includes a plurality of bores 31 which each receive a respective support member 23 and are configured in accordance with the arrangement of carrier units 15 in the workpiece carrier 7.

In this embodiment the platform body 25 comprises an upper body element 41 and a lower body element 43, which together define a cavity 45, which extends laterally across the platform body 25 and receives a locking member 51, as will be described in more detail hereinbelow.

In this embodiment the support platform 21 further comprises a locking member 51, which is operative to lock the vertical or Z-axis height of the support members 23.

In this embodiment the locking member 51, here in the form of a plate, includes a plurality of apertures 53 which are arranged in correspondence with the plurality of bores 31 in the platform body 25, and is actuatable between a first, unlocked or rest position, in which the support members 23 are movable vertically, such as to allow adjustment of the height of the support members 23, and a second, locked position in which the locking member 51 engages a part of the support members 23, in this embodiment stems 77 of the support members 23, and locks the vertical or Z-axis height of the support members 23.

In this embodiment the locking member 51 includes a plurality of contact elements 54, here in the form of resilient elements, such as a rubber or elastomeric pad, which are disposed at the respective apertures 53, such as to provide a contact surface with the respective support member 23 when the locking member 51 is in the locked position.

In this embodiment the support platform 21 further comprises a biasing element 55, here a spring element, which acts to bias the locking member 51 to the unlocked position when the locking member 51 is not actuated. With this configuration, the locking member 51 automatically adopts the unlocked position without requiring any separate actuation or intervention.

In this embodiment the support module 19 comprises an integral module which is removable from a processing machine, such as a screen printing machine, as a single unitary module.

In this embodiment the support module 19 is re-configurable, such that the support members 23 can be arranged in any desired configuration and additionally or alternatively allows different support members 23 to be fitted to the support platform 21.

The support members 23 each comprise a base 56 which is attached to the support platform 21, a body 57 which is movably coupled to the base 56, in this embodiment at least in the vertical or Z-axis orient, and a biasing element 59 which acts to bias the body 57 away from the base 56, and the support platform 21 on which the base 56 is mounted, in this embodiment upwardly, such as to allow for depression of the body 57 from an unbiased or rest position and return the body 57 to the unbiased position on releasing the bias as applied to the body 57.

In this embodiment the body 57 comprises a first, lower body part 61 and a second, upper body part 63, at least part of which is movably coupled to the lower body part 61, here at least in a horizontal or X-Y plane and preferably allowing for rotation θ relative to the vertical or Z-axis.

In this embodiment the upper body part 63 includes a head 64 which provides a support surface 65 for supporting a workpiece W.

In this embodiment the body 57 further comprises a resilient coupling 75 which resiliently couples the upper body part 63 to the lower body part 61, such that the upper body part 63 is displaceable in a horizontal orient relative to the lower body part 61, and the support platform 21 to which the lower body part 61 is coupled, from a first, unbiased position to a second, biased reference position by operation of the referencing assembly 11, as will be described in more detail hereinbelow, and, when released, the upper body part 63 returns to the first, unbiased position.

In this embodiment movement of the upper body part 63 relative to the lower body part 61 is constrained such that the support member 23 provides a stable support to the supported workpiece W.

With this configuration, the workpieces W are each individually referenced to a reference position and each returns to their original position without any control input on releasing the workpieces W, thus allowing for the workpieces W to be engaged directly in the carrier units 15 of the workpiece carrier 7 without any positional adjustment by simply raising the workpiece carrier 7 in relation to the supported workpieces W, which can be done by raising the workpiece carrier 7 with the support module 19 fixed, lowering the support module 19 with the workpiece carrier 7 fixed or both raising the workpiece carrier 7 and lowering the support module 19.

In this embodiment the resilient coupling 75 comprises an elastomeric or rubber element, which is deflected on displacement of the upper body part 63.

In one embodiment the resilient coupling 75 could be formed of a low durometer material, such as a disk or sleeve.

In another embodiment the resilient coupling 75 could be formed of a foam material, such as a disk or sleeve.

In this embodiment the resilient coupling 75 comprises a plurality of resilient coupling elements.

In another embodiment the resilient coupling 75 could comprise a single resilient coupling element.

In one embodiment the resilient coupling 75 could comprise one or more spring elements, such as helicoidal or leaf springs.

In another embodiment the resilient coupling 75 could comprise one or more elastomeric or rubber elements, such as elastic bands.

In other embodiments the resilient coupling could comprise combinations of any of the above-described elements.

In this embodiment the body 57 includes a stem 77 which extends into the respective bore 31 in the support platform 21, and is slideable within the bore 31 to allow for displacement of the body 57 in the vertical or Z-axis orient.

In this embodiment the stem 77 extends from the upper body part 63 through the respective bore 31 in the support platform 21, and defines a fluid channel 81, which extends between the upper body part 63 and a lower surface of the support platform 21, which is fluidly connected to a vacuum or reduced pressure source 85, whereby a vacuum or reduced pressure is applied to the support surface 65 of the head 64 of the upper body part 63, such as to fix a supported workpiece W at a defined position on the upper body part 63, and also maintain the workpiece W flat, where the workpiece W is warped or flexible.

In this embodiment, by applying a vacuum or reduced pressure source 85 commonly to the manifold cavity 20, individual connections to each of the support members 23 are not required, and the support module 19 can be removed as an integral module.

The referencing assembly 11 comprises a support platform 100, a horizontal referencer 101 for referencing the workpieces W supported by the carrier units 15 of the workpiece carrier 7 in a horizontal orient relative to the support platform 100, and a vertical referencer 102 for referencing the workpieces W supported by the carrier units 15 of the workpiece carrier 7 in a vertical orient relative to the support platform 100.

The horizontal referencer 101 comprises a horizontal referencing unit 103 which is supported by the support platform 100 over the upper body parts 63 of the support members 23, and an actuation mechanism 104 which is operative to actuate the horizontal referencing unit 103 to reference the workpieces W supported by the carrier units 15 of the workpiece carrier 7 in a horizontal or X-Y orient.

In this embodiment the horizontal referencing unit 103 comprises first and second referencing members 111*a, b*, here in the form of plates, which each include a plurality of counterpart apertures 113*a, b* which are arranged in correspondence with the support members 23 and are configured to receive the respective workpieces W as supported thereby.

In this embodiment the first and second referencing members 111*a, b* are displaceable in opposite directions, such as to center the workpieces W in the respective apertures 113*a, b* and reference the horizontal or X-Y orient of the workpieces W.

In this embodiment the first, upper referencing member 111*a* includes apertures 113*a* of fixed shape, here having a rectangular profile which is oversized relative to the size of the workpieces W, at least one edge of which, here two adjacent orthogonal edges, define a workpiece-engagement surface, and the second, lower referencing member 111*b* includes counterpart apertures 113*b*, at least one edge of which, here two adjacent orthogonal edges, include a projection 115*a, b* which extends into the respective apertures 113*a* in the upper plate element 111*a* to an upper surface of the upper referencing member 111*a* and defines a workpiece-engagement surface.

With this configuration, the at least one, here adjacent, orthogonal edges, of the apertures 113*a* in the upper referencing member 111*a* and the at least one, here first and second projections 115*a, b* at adjacent, orthogonal edges at the apertures 113*b* in the lower referencing member 111*b* act to engage opposite edges of the respective workpieces W and center the workpieces W at predetermined positions in the horizontal orient, here both in terms of their X, Y position and in terms of their rotation θ relative to the vertical or Z-axis.

In this embodiment the referencing members 111*a, b* are moved along an axis which is inclined to at least one edge of the workpieces W. In one embodiment, where the workpieces W have orthogonal edges, the referencing members 111*a, b* are moved in a direction intermediate the two orthogonal edges, typically at 45 degrees thereto.

In this embodiment the workpieces W have a rectangular shape and the apertures 113*a, b* define orthogonal edges against which the workpieces W are engaged.

In an alternative embodiment the apertures 113*a, b* could define point contacts, such that the workpieces W are contacted only at points along the edges thereof.

In another alternative embodiment the apertures 113*a, b* could include resilient contacts, such as spring contacts, such that the workpieces W are contacted only at points along the edges thereof.

In this embodiment the support platform 100 comprises a support body 117 which includes an aperture 119 through which the upper body parts 63 of the support members 23 are displaceable.

In this embodiment the actuation mechanism 104 comprises a plurality of actuators 121*a-f*, 122*a-f* which are configured to displace the first and second referencing members 111*a, b* in a horizontal plane.

In this embodiment the actuation mechanism 104 comprises a plurality of first actuators 121*a-f* which engage the first referencing member 111*a* and displace the same in a first direction H1 and a plurality of second actuators 122*a-f* which engage the second referencing member 111*b* and displace the same in a second direction H2, which is opposite to the first direction H1.

The vertical referencer 102 comprises a vertical referencing member 125 and a transport mechanism 127 for transporting the vertical referencing member 125 from a first, inoperative or rest position to a second, operative position over the support members 23 of the support module 19.

In this embodiment the vertical referencing member 125 comprises a plate, here a relatively-heavy plate, against which the workpieces W as supported by the support members 23 are biased, which acts to reference the supported workpieces W to a common height when the workpieces W are raised from the carrier units 15 in the workpiece carrier 7.

In this embodiment the vertical referencing member 125 has a planar lower surface, but in other embodiments the lower surface could be profiled, such as by way of including recesses, in order to accommodate features or components on the upper surfaces of the workpieces W.

In this embodiment the vertical referencing member 125 is located adjacent and below the support platform 100 when in the inoperative or rest position.

In this embodiment a lower surface of the vertical referencing member 125 is located at a predetermined height relative to the support platform 100 when in the operative position. In one embodiment the vertical referencing member 125 is located on the upper surface of the horizontal referencing unit 103 when in the operative position.

In use, when raising the support module 19, the support members 23 are raised until the supported workpieces W each engage the lower surface of the vertical referencing member 125. The workpieces W can engage at different times depending upon the thicknesses of the workpieces W, and this configuration also allows for some variation in the heights of the support members 23, meaning that the support members 23 do not need to be calibrated to have the same height in the manner of existing support systems. As the support members 23 engage the lower surface of the vertical referencing member 125, the support platform 21 can be raised further as the stems 77 are slideable through the respective bores 31 in the platform body 25, and the support platform 21 can be raised until the upper surfaces of all of the workpieces W engage the lower surface of the vertical referencing member 125. When in this configuration, the locking member 51 is actuated to lock the vertical or Z-axis height of the support members 23, such that the workpieces W are at a common vertical or Z-axis position.

In one embodiment the vertical referencer 102 could be omitted. In one embodiment the support members 23 are calibrated and the workpieces W have a substantially uniform thickness, In this embodiment the transport mechanism 127 comprises a support cradle 128 which comprises first and second arms 131 which engage lateral edges of the vertical referencing member 125 and a body 133 which supports the arms 131 in fixed relation, a pivotable coupling 135 which couples the support cradle 128 relative to the support platform 100 and acts to translate the support cradle 128 between the inoperative and operative positions, and an actuator 137 which is operable to drive the support cradle 128 between the inoperative and operative positions.

FIGS. 6(*a-j*) illustrate the operative steps in use of the workpiece support system of FIG. 1.

As illustrated in FIG. 6(*a*), with the support module 19 of the support assembly 3 in a lowered configuration relative to the horizontal referencing unit 103, a workpiece carrier 7 is introduced beneath the horizontal referencing unit 103.

Figure 6A:
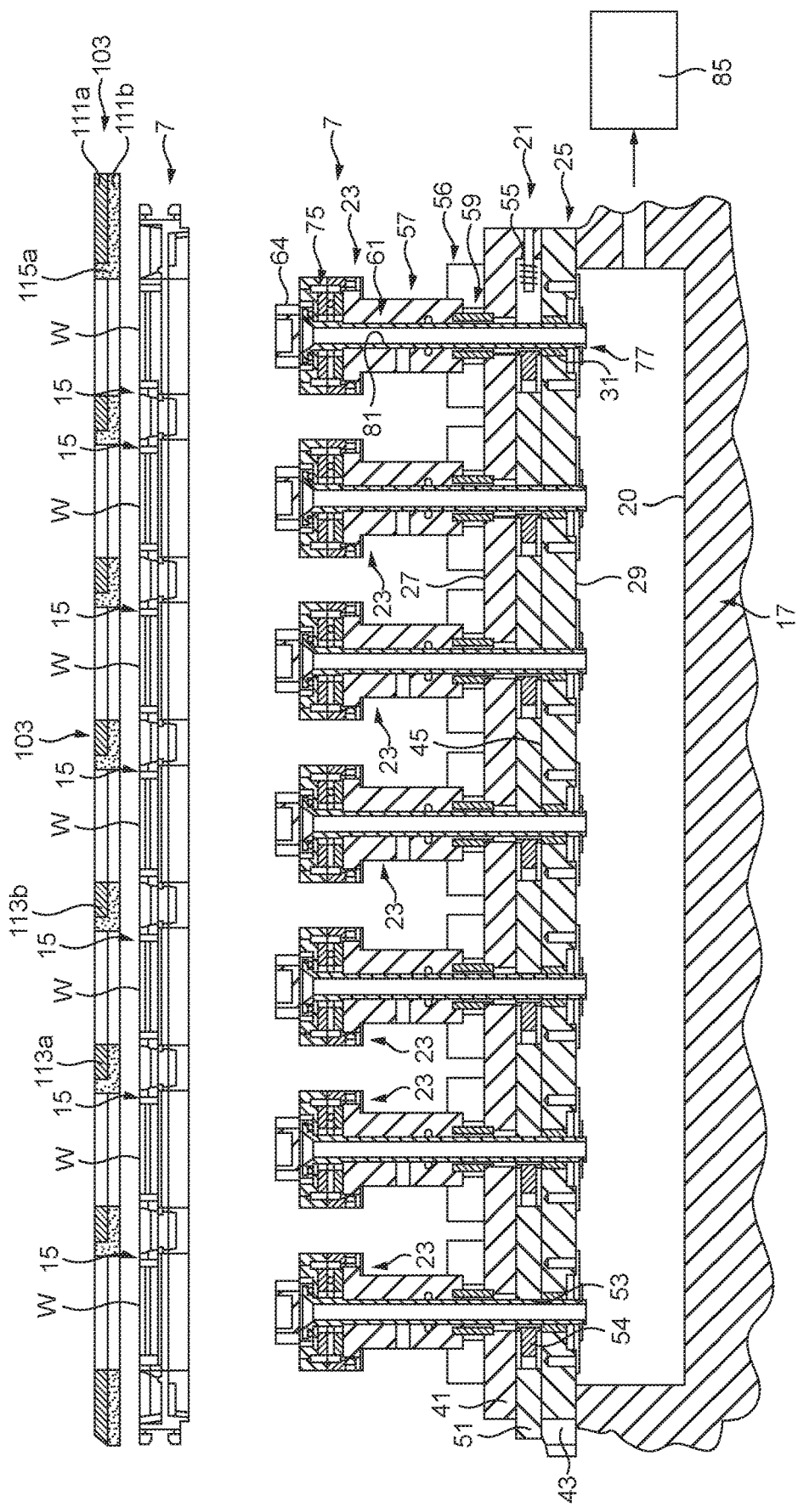
FIGS. 6(*a-j*) illustrate the operative steps in use of the workpiece support system of FIG. 1.
Figure 6B:
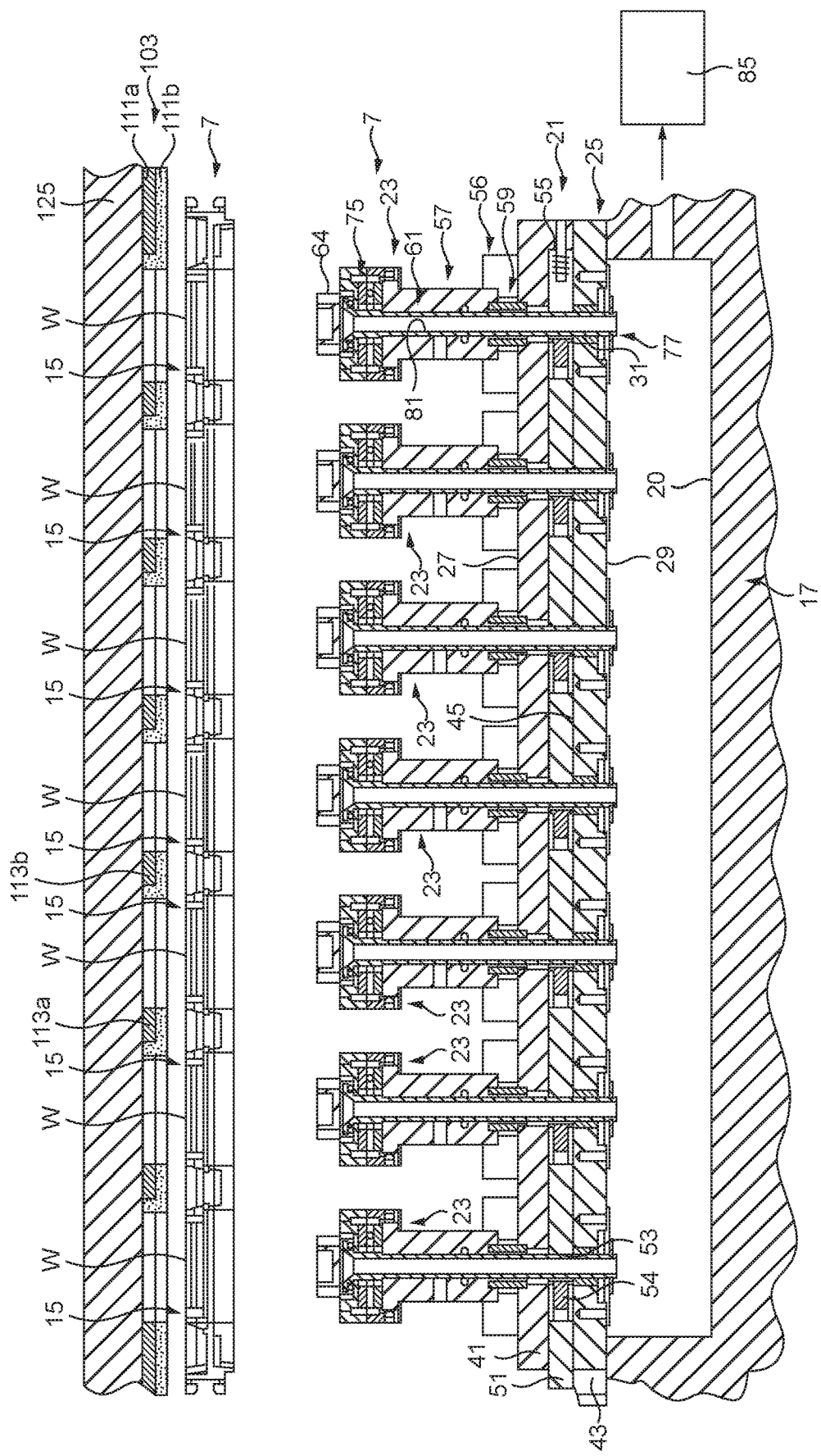

The vertical referencer 102 is operated to move the vertical referencing member 125 from the inoperative position to the operative position above the horizontal referencing unit 103, as illustrated in FIG. 6(b).

Figure 6C:
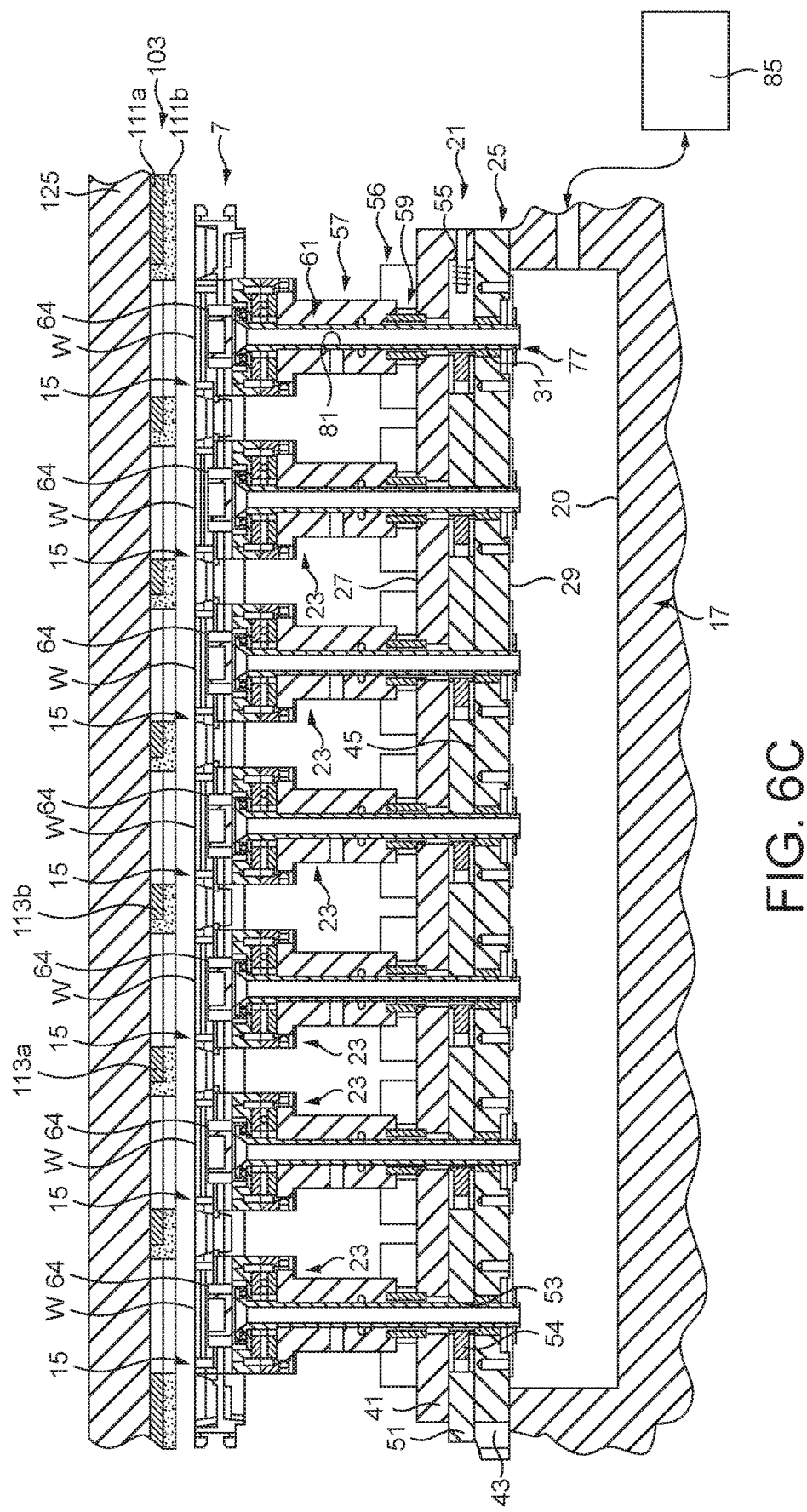

The vacuum pressure source 85 is then actuated to provide a vacuum at the heads of the support members 23, and the support module 19 of the support assembly 3 is raised relative to the horizontal referencing unit 103. As illustrated in FIG. 6(c), the heads 64 of the support members 23 engage a lower surface of the workpieces W, which are held thereto by the vacuum thereat, and lift the workpieces W from the carrier units 15 of the workpiece carrier 7.

Figure 6D:
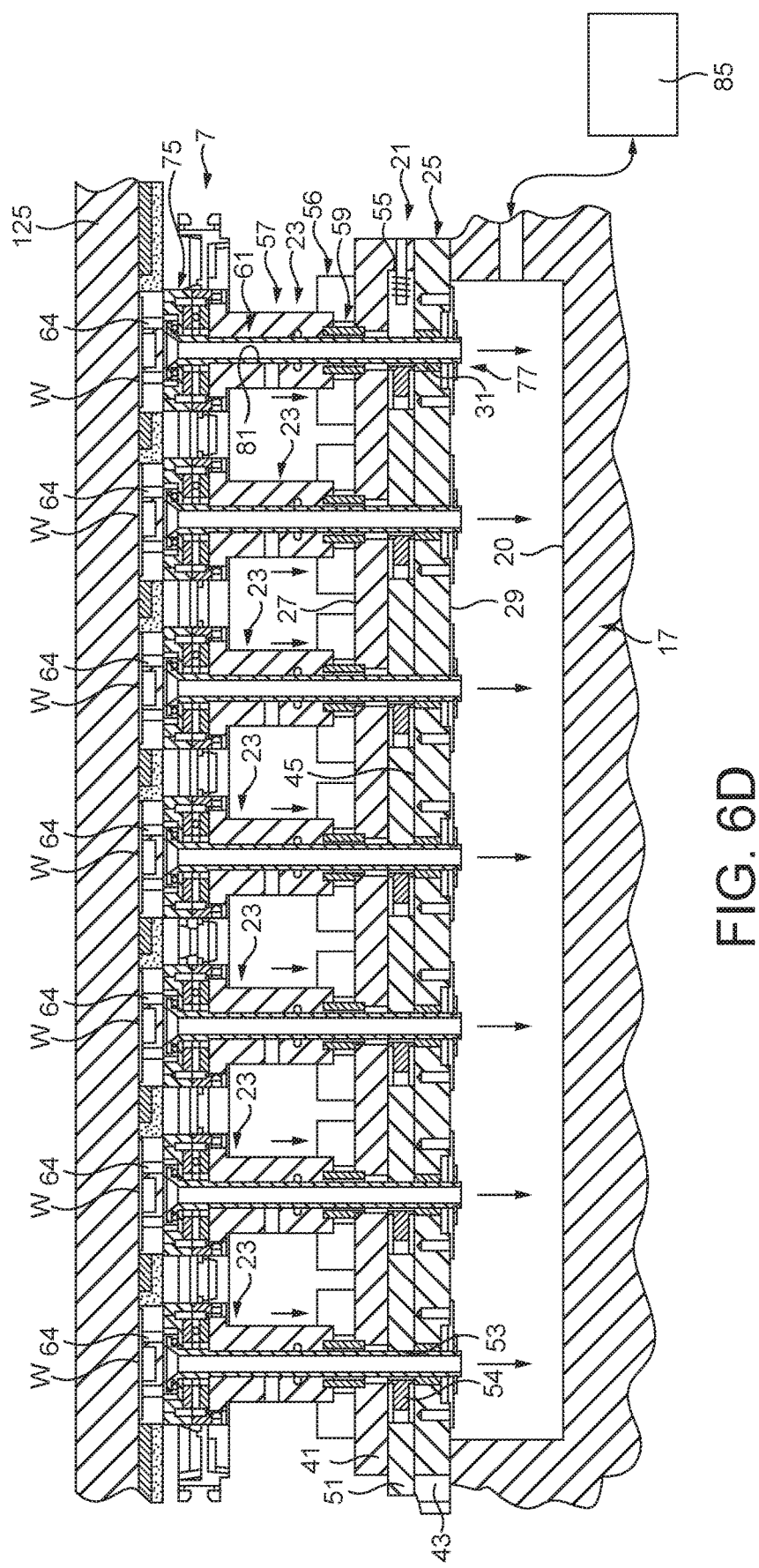

The support members 23 are raised until the supported workpieces W each engage the lower surface of the vertical referencing member 125, as illustrated in FIG. 6(d), with the workpieces W engaging at different times depending upon the thicknesses of the workpieces W. In this configuration the workpieces W are located in the respective apertures 113a, b in the referencing members 111a, b of the horizontal referencing unit 103.

Figure 6E:
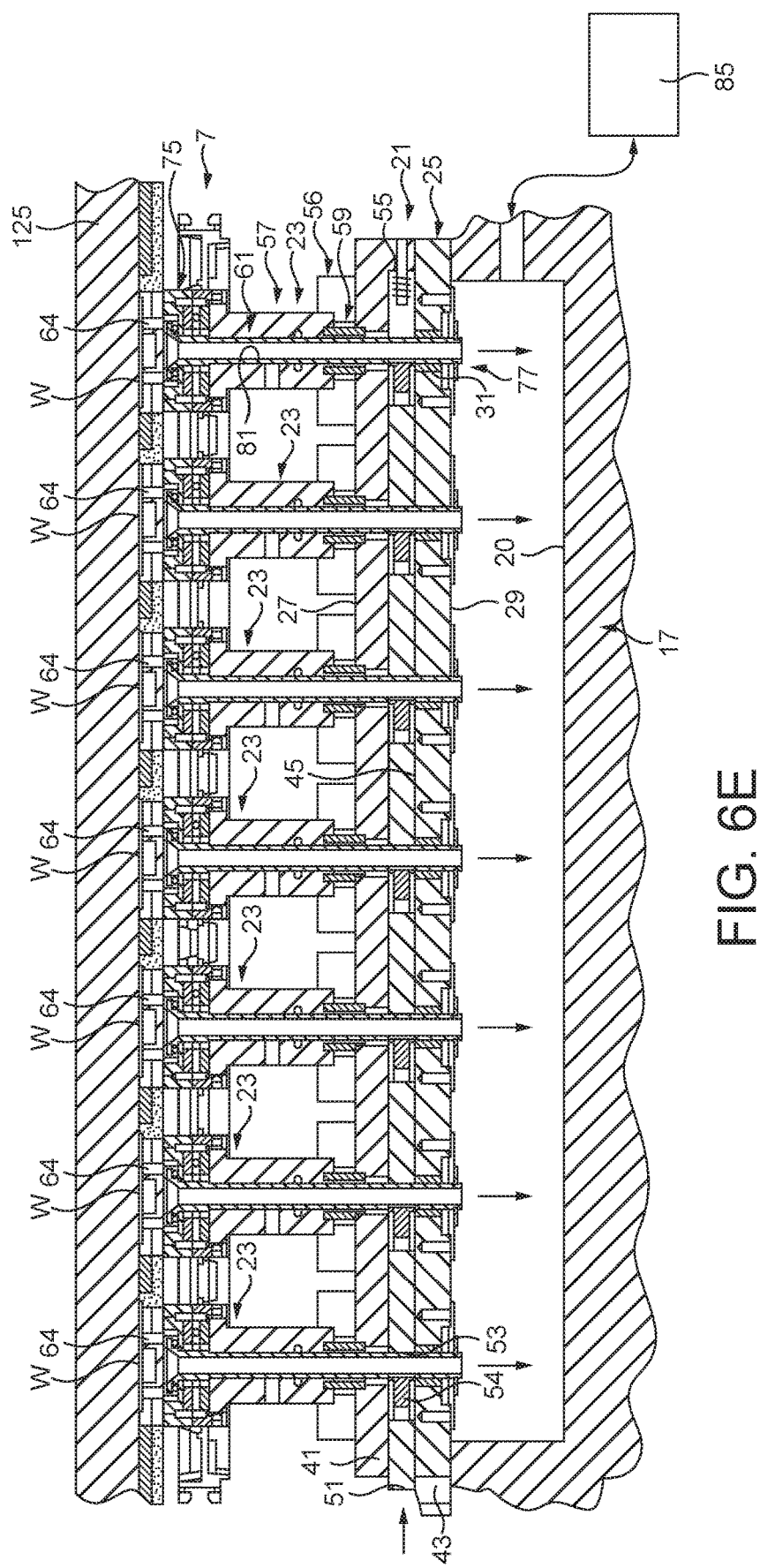

With the workpieces W referenced in the vertical position, locking member 51 of the support platform 21 is actuated to lock the support members 23 at the vertical or Z-axis height, in this embodiment by engagement of the contact elements 54 with the stems 77 of the support members 23, as illustrated in FIG. 6(e).

Figure 6F:
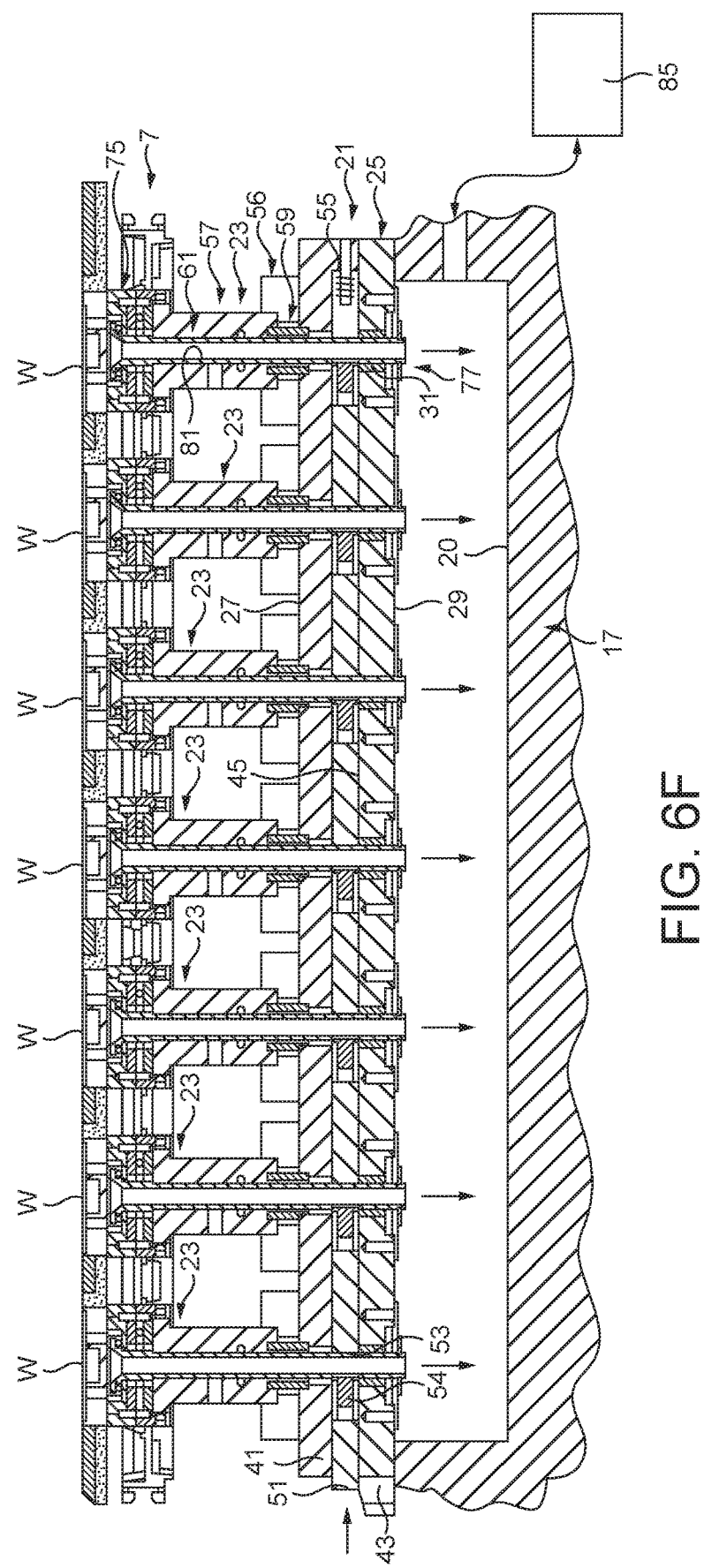

The vertical referencer 102 is operated to move the vertical referencing member 125 from the operative position to the inoperative position away from the horizontal referencing unit 103, as illustrated in FIG. 6(f).

As illustrated in FIG. 6(g), the actuators 121a-f, 122a-f of the actuation mechanism 104 are actuated to displace the first referencing member 111a in a first direction H1 and the second referencing member 111b in a second direction H2, being opposite to the first direction H1, which causes the adjacent, orthogonal edges of the apertures 113a in the upper referencing member 111a and the first and second projections 115a, b at adjacent, orthogonal edges at the apertures 113b in the lower referencing member 111b to engage opposite edges of the respective workpieces W and center the workpieces W at predetermined positions in the horizontal orient, here both in terms of their X, Y position and in terms of their rotation θ relative to the vertical or Z-axis. This referencing of the workpieces W is made possible by the resilient couplings 75 between the lower and upper body parts 61, 63 of the support members 23 which allow the upper body part 63, and hence the head 64 thereof which supports the workpiece W, to be displaced from a first, unbiased position to a second, biased position.

In this horizontal referenced position, a process operation is performed on the workpieces W. Such operations include printing and pick-and-place operations, by way of example.

Figure 6H:
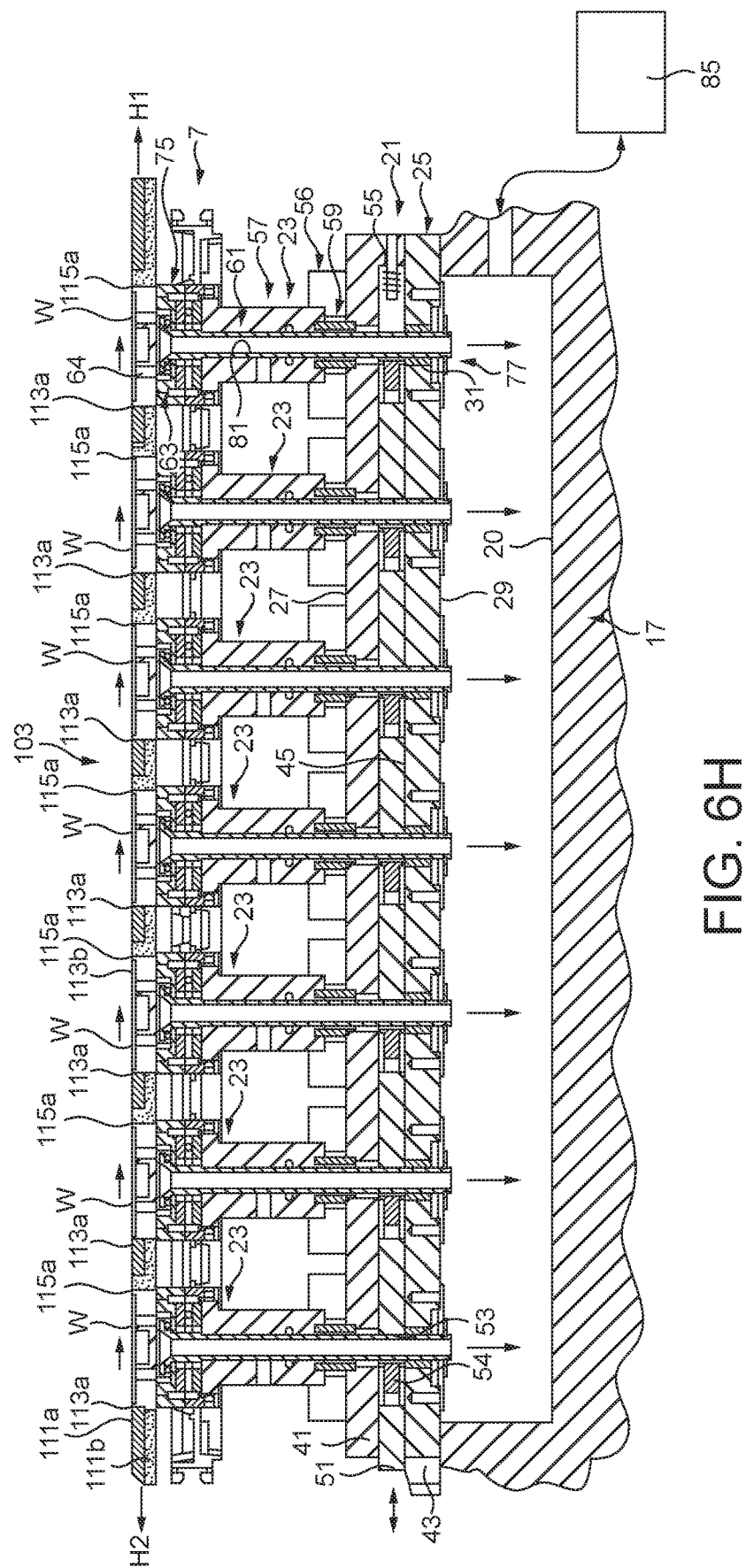

As illustrated in FIG. 6(h), the actuators 121a-f, 122a-f of the actuation mechanism 104 are actuated to displace the first referencing member 111a in the second direction H2 and the second referencing member 111b in the first direction H1, which causes the adjacent, orthogonal edges of the apertures 113a in the upper referencing member 111a and the first and second projections 115a, b at adjacent, orthogonal edges at the apertures 113b in the lower referencing member 111b to dis-engage opposite edges of the respective workpieces W. With this action, the resilient couplings 75 between the lower and upper body parts 61, 63 of the support members 23 cause the upper body part 63, and hence the head 64 thereof which supports the workpiece W, to return from the biased position to the unbiased position without any intervention.

The vacuum pressure source 85 is then de-actuated to release the vacuum at the heads 64 of the support members 23, and the support module 19 of the support assembly 3 is lowered relative to the horizontal referencing unit 103.

Figure 6I:
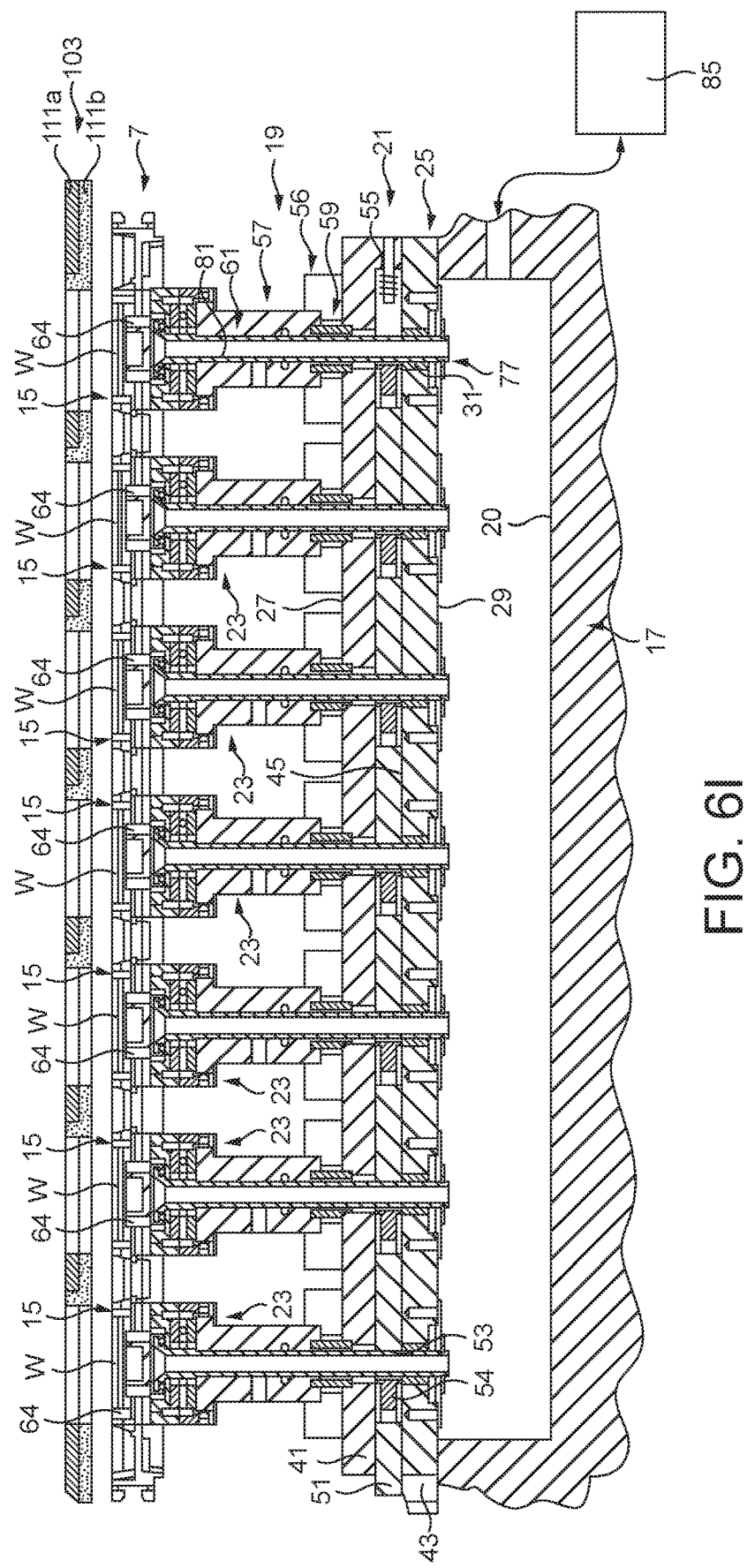

As illustrated in FIG. 6(i), the heads 64 of the support members 23 dis-engage a lower surface of the workpieces W as the workpieces W are seated in the carrier units 15 of the workpiece carrier 7.

The support module 19 of the support assembly 3 is returned to the lowered configuration relative to the horizontal referencing unit 103, which allows the workpiece carrier 7 to be transported from beneath the horizontal referencing unit 103 and the process repeated.

Finally, it will be understood that the present invention has been described in its preferred embodiments and can be modified in many different ways without departing from the scope of the invention as defined by the appended claims.

In one embodiment the workpieces W could comprise a plurality of workpiece elements which are supported by a common carrier element.

In one modification the horizontal referencing unit 103 could comprise only a single referencing member 111a which is displaced in a horizontal plane and acts to engage all of the workpieces W to move the same to predetermined reference positions in the horizontal or X-Y plane.

What is claimed is:

1. A support member for supporting a workpiece thereon, wherein the support member comprises a support and a body which includes a support surface which provides stable support for the workpiece thereon and a resilient coupling which resiliently couples at least part of the body relative to the support, such that the at least part of the body is displaceable relative to the support in at least a horizontal orient from a first, unbiased position to a second, biased reference position, and, when released, the at least part of the body returns to the first, unbiased position, wherein the body of the support member includes a stem which extends therethrough from the at least part of the body, and wherein the stem extends to the support surface, whereby a vacuum or reduced pressure source is applied to the support surface, such as to fix a supported workpiece at a defined position thereon, wherein the at least part of the body is displaceable in the vertical orient, such as to allow adjustment of the vertical or Z-axis position of the support member, and wherein the at least part of the body is lockable at a referenced vertical or Z-axis position.

2. The support member of claim 1, wherein the support member further comprises a base to which the at least part of the body is movably coupled in the vertical orient, and a biasing element which acts to bias the at least part of the body from the base, such as to allow for movement of the at least part of the body relative to the base from a first, rest position on application of a bias to the body and provide for the body to be returned to the first, rest position on release of the bias as applied against the biasing element.

3. The support member of claim 2, wherein the base of the support member is attached to a support platform.

4. The support member of claim 1, wherein the body of the support member comprises a lower body part and an upper body part which includes the support surface and is movably coupled to the lower body part, such that the upper body part is displaceable relative to the lower body part.

5. The support member of claim 4, wherein the upper body part has a head which includes the support surface for supporting a workpiece.

6. The support member of claim 5, wherein the head is replaceable.

7. The support member of claim 4, wherein the upper body part is replaceable.

8. The support member of claim 4, wherein the resilient coupling couples the upper body part to the lower body part.

9. The support member of claim 4, wherein the resilient coupling comprises an elastomeric or rubber coupling which is deflectable.

10. The support member of claim 9, wherein the resilient coupling is formed of a low durometer material or a foam material, optionally in the form of a disk or sleeve.

11. The support member of claim 4, wherein the resilient coupling comprises one or more spring elements.

12. The support member of claim 4, wherein the resilient coupling comprises one or more helicoidal or leaf springs.

13. The support member of claim 4, wherein the resilient coupling comprises one or more resilient elements.

14. The support member of claim 13, wherein the resilient coupling comprises a single resilient element.

15. The support member of claim 14, wherein the resilient coupling comprises a plurality of resilient elements.

16. The support member of claim 15, wherein the resilient elements comprise elastomeric or rubber elements.

17. A workpiece support assembly for supporting a plurality of singulated workpieces, wherein the support assembly comprises a plurality of support members, which each support a workpiece, wherein each support member comprises a support and a body which includes a support surface which provides stable support for the workpiece thereon and a resilient coupling which resiliently couples at least part of the body relative to the support, such that the at least part of the body is displaceable relative to the support in at least a horizontal orient from a first, unbiased position to a second, biased reference position, and, when released, the at least part of the body returns to the first, unbiased position, wherein the body of the support member includes a stem which extends therethrough from the at least part of the body, and wherein the stem extends to the support surface, whereby a vacuum or reduced pressure source is applied to the support surface, such as to fix a supported workpiece at a defined position thereon, wherein the at least part of the body is displaceable in the vertical orient, such as to allow adjustment of the vertical or Z-axis position of the support member, and wherein the at least part of the body is lockable at a referenced vertical or Z-axis position.

\* \* \* \* \*